(12) United States Patent
Morishige et al.

(10) Patent No.: US 6,733,848 B2
(45) Date of Patent: May 11, 2004

(54) THIN FILM FORMING EQUIPMENT AND METHOD

(75) Inventors: Yukio Morishige, Tokyo (JP); Makoto Omiya, Tokyo (JP)

(73) Assignee: NEC Corporation, Tokyo (JP)

( * ) Notice: Subject to any disclaimer, the term of this patent is extended or adjusted under 35 U.S.C. 154(b) by 62 days.

(21) Appl. No.: 09/989,162

(22) Filed: Nov. 21, 2001

(65) Prior Publication Data

US 2002/0076509 A1 Jun. 20, 2002

Related U.S. Application Data

(62) Division of application No. 09/533,244, filed on Mar. 22, 2000, now Pat. No. 6,336,975.

(30) Foreign Application Priority Data

Mar. 24, 1999 (JP) .............................................. 11-080506

(51) Int. Cl.⁷ .............................................. C23C 14/14
(52) U.S. Cl. ...................................... 427/572; 427/586
(58) Field of Search ................................. 427/572, 586

(56) References Cited

U.S. PATENT DOCUMENTS

| | | |
|---|---|---|
| 4,801,352 A | 1/1989 | Piwczyk |
| 5,246,526 A | 9/1993 | Yamaguchi et al. |
| 5,777,847 A | 7/1998 | Tokuno et al. |
| 5,964,947 A | 10/1999 | Zhao et al. |

FOREIGN PATENT DOCUMENTS

| | | | |
|---|---|---|---|
| JP | 1-502149 | 7/1989 | |
| JP | 7-161802 | 6/1995 | |
| JP | 8-236451 | 9/1996 | |
| JP | 11-3884 | 1/1999 | |
| JP | 11-003884 | * | 6/1999 |

* cited by examiner

Primary Examiner—Gregory Mills
Assistant Examiner—Sylvia R MacArthur
(74) Attorney, Agent, or Firm—Sughrue Mion, PLLC

(57) ABSTRACT

A thin film forming equipment and a method for forming thin films are provided which are capable of forming the thin film of high quality and of effectively preventing CVD material gas from leaking to surroundings at a low cost. The thin film equipment contains a substrate, a substrate holding device used to hold the substrate and a device used to provide an atmospheric gas to a surface of the substrate held by the substrate holding device, wherein an upper face of the substrate held by the substrate holding device and an upper face of the substrate holding device are almost on one plane.

6 Claims, 3 Drawing Sheets

THIN FILM FORMING EQUIPMENT AND METHOD

This is a divisional of application Ser. No. 09/533,244 filed Mar. 22, 2000 now U.S. Pat. No. 6,336,975; the disclosure of which is incorporated herein by reference.

BACKGROUND OF THE INVENTION

1. Field of the Invention

The present invention relates to a thin film forming equipment and a thin film forming method used for correcting defects in a substrate having a plane pattern structure such as a photomask, liquid crystal substrate or a like.

2. Description of the Related Art

AlaserCVD (Chemical Vapor Deposition) method is disclosed in U.S. Pat. No. 4,801,352 in which a thin film is formed at a local place on a substrate by radiating a specified gas introduced at the local place on the substrate with a laser to decompose the substrate.

FIG. 4 is a cross-sectional view of conventional thin film forming equipment. As depicted in FIG. 4, a gas window 52 is mounted on a substrate 51. The gas window 52 is so constructed that there is a small clearance (for example, of 0.5 mm) between an upper face of the substrate 51 and a lower face of the gas window 52. The gas window 52 is provided with a gas retention chamber 53, a gas introducing section 54, a gas exhausting section 55 and a laser window 56. The gas retention chamber 53 is a chamber for the retention of CVD materials such as gases of organic metal compounds or a like. The gas introducing section 54 is a section used for introducing the CVD materials into the gas retention chamber 53. The gas exhausting section 55 is composed of ring-shaped trenches 55a formed in the circumference of the gas retention chamber 53 and of an exhausting section 55c connected through a hole 55b, which is used for exhausting the gas discharged from the gas retention chamber 53. The laser window 56 is used for radiating the CVD materials staying in the gas retention chamber 53 with the laser to decompose them.

The substrate 51 is held by the holder 57. That is, the substrate 51 is held by hanging an end portion of the substrate 51 on a step section 57a of the holder 57. A transmitting illuminating source 58 is used to check a quality of films formed by the CVD process. A lens 59 is used for collecting laser light. A flow of gases used as the CVD materials is shown by arrow marks in FIG. 4.

However, following problems arise when the gas retention chamber 53 of the above equipment is positioned in the proximity of the end portion of the substrate 51 and the thin film is formed in the proximity of the end portion of the substrate 51. Since there is a step area between the upper face of the substrate 51 and the upper face of the holder 57, if the gas retention chamber 53 is positioned in the proximity of the end portion of the substrate 51, the gas is suctioned from the exhausting section 55c through the ring-shaped trench 55a and the gas exhausted from the gas retention chamber 53 is to be ejected, air currents are influenced at the step area and the air flows into the gas retention chamber 53 as shown by the arrow "a" in some cases, causing degradation in the quality of the film formed by the CVD process.

Also, there are some cases in which gases used as the CVD materials are not completely ejected through the trench 55a from the exhausting section 55c. In some cases, gases used as the CVD materials leak to surroundings.

SUMMARY OF THE INVENTION

In view of the above, it is an object of the present invention to provide a thin film forming equipment and a method for forming thin films which are capable of forming the thin film of high quality and of effectively preventing gases used as CVD materials or a like from leaking to surroundings at a low cost.

According to a first aspect of the present invention, there is provided a thin film forming equipment including:

a substrate;

a substrate holding device used to hold the substrate;

a device used to provide atmospheric gas to a surface of the substrate held by the substrate holding device; and whereby an upper face of the substrate held by the substrate holding device and an upper face of the substrate holding device are almost on one plane.

In the foregoing, a preferable mode is one wherein the substrate holding device has a cover body which is disposed in an area surrounding the substrate held by the substrate holding device and wherein an upper face of the cover body and the upper face of the substrate are almost on one plane.

Also, a preferable mode is one wherein the substrate holding device is provided with a trench along a circumference of the held substrate and the atmospheric gas is able to be ejected through the trench.

Also, a preferable mode is one wherein a sheet is provided at a boundary between the held substrate and the substrate holding device.

Furthermore, a preferable mode is one wherein the thin film forming equipment provides the atmospheric gas to a surface of the substrate held by the substrate holding device and forms the thin film on the substrate by decomposing the atmospheric gas and wherein the thin film forming equipment further includes gas introducing means for introducing the atmospheric gas, a gas retention chamber for retention of the introduced gas using the gas introducing means, gas discharging means for discharging gas ejected from the gas retention means and laser radiating means for decomposing gas staying at the gas retention chamber by laser irradiation.

According to a second aspect of the present invention, there is provided a method for forming a thin film on a substrate by decomposing gas introduced to a surface of a substrate held by a substrate holding device including a step of preventing the gas introduced to the surface of the substrate from being influenced by outside air.

According to a third aspect of the present invention, there is provided a method for forming a thin film on a substrate by introducing gas to a surface of a substrate held by a substrate holding device, by radiating the introduced gas with laser, by decomposing the introduced gas and then by suctioning and discharging decompositional by-products, including a step of preventing the gas introduced to the surface of the substrate from being influenced by outside air.

In the foregoing, it is preferable that the upper face of the substrate and the upper face of the substrate holding device are almost on one plane to prevent gas introduced on the substrate surface from being influenced by outside gas.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
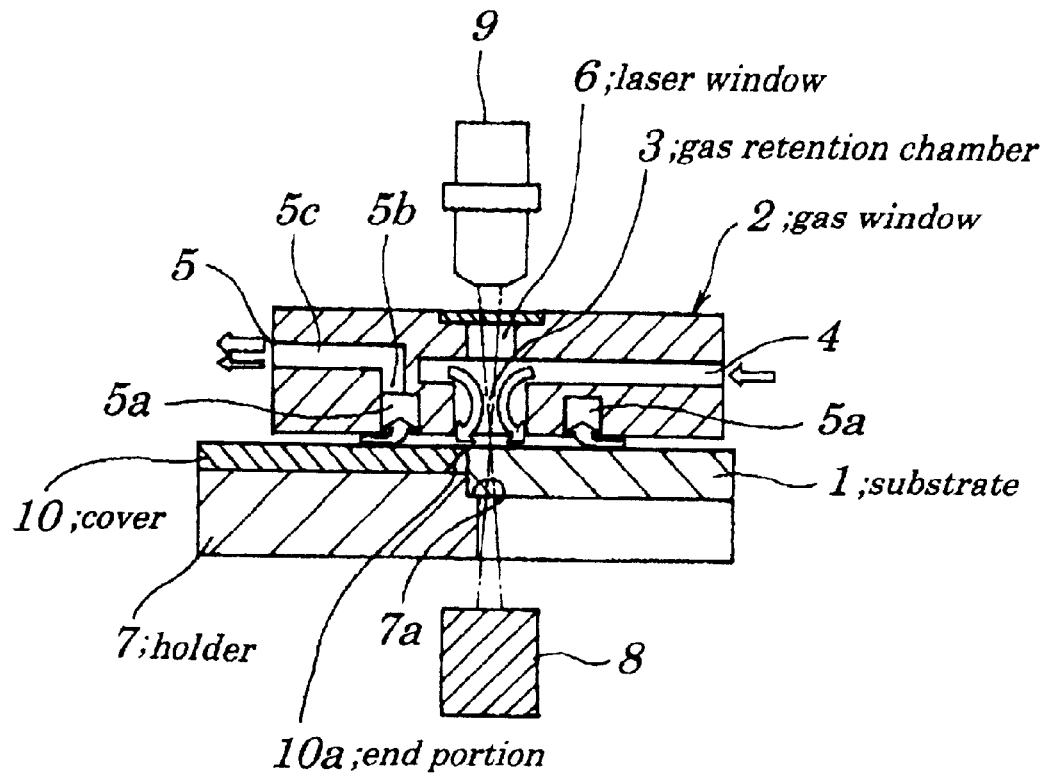
FIG. 1 is a cross-sectional view of thin film forming equipment according to a first embodiment of the present invention.

FIG. 1 is a cross-sectional view of thin film forming equipment according to a first embodiment of the present invention. As shown in FIG. 1, the gas window 2 is so displaced that there is a small clearance (0.5 mm) between an upper face of the substrate 1 and a lower face of the gas window 2.

The gas window 2 is comprised of a gas retention chamber 3, a gas exhausting section 5 (including an exhausting section 5c communicating with trench 5a and trench 5b through a hole 5b) and a laser window 6. The gas retention chamber 3 is a chamber for the retention of CVD (Chemical Vapor Deposition) materials such as gases of organic metal compounds or a like. The gas introducing section 4 is used for introducing the CVD materials into the gas retention chamber 3. The gas exhausting section 5 is used for exhausting gases discharged from the gas retention chamber 3. The laser window 6 is used for radiating the CVD materials staying in the gas retention chamber 3 with the laser to decompose them.

The substrate 1 is held by the holder 7. That is, the substrate 1 is held by hanging an end portion of the substrate 1 on a step portion 7a of a holder 7. A transmitting illuminating source 8 is used to check a quality of a film formed by the CVD process. A lens 9 is for collecting laser light. Configurations of the equipment shown in FIG. 1 differ greatly from those of the equipment in FIG. 4 in that the former (Present Embodiment) has a cover while the latter (Prior Art) does not. As shown in FIG. 1, according to the first embodiment, the equipment is provided with the cover 10 in a manner that it covers an upper face of the holder 7 surrounding the substrate 1. This allows an upper face of the substrate and an upper face of the cover 10 on the holder 7 to be on one plane.

An end portion 10a of the cover 10 disposed opposite to the substrate 1 is formed in a tapered form. This can prevent the cover 10 from contacting with one end of the substrate 1 at a time of opening and closing of the cover 10. According to the present embodiment, even if the thin film is formed by the same CVD method as in the prior art shown in FIG. 4, the flow-in of air does not occur, unlike in the case of the prior art in FIG. 4 in which the flow-in of air is shown by an arrow "a". That is, during a formation of the thin film, since outside air (i.e., oxygen) does not flow into the gas retention chamber 3, gases used as the CVD materials introduced into the gas retention chamber 3 are not influenced by the outside air. Therefore, the thin film of a high quality can be formed by the CVD process. Also, gases used as the CVD materials do not leak to the surroundings. Since these effects can be obtained simply by providing the cover 10, the first embodiment of the present invention can be carried out very simply and at a low cost. The material for the CVD, i.e., $Cr(CO)_6$ is introduced by a carrier gas (Ar gas with a flow-rate of 200 sccm (standard cubic centimeter per minute)) into the gas retention chamber 3 in a manner that a pressure of $Cr(CO)_6$ is at 0.3 Torr. A discharging flow-rate at the gas exhausting section is set to 600 sccm. The Cr thin film is then formed in proximity to the end portion of the substrate by laser radiation and the CVD process.

Figure 4:
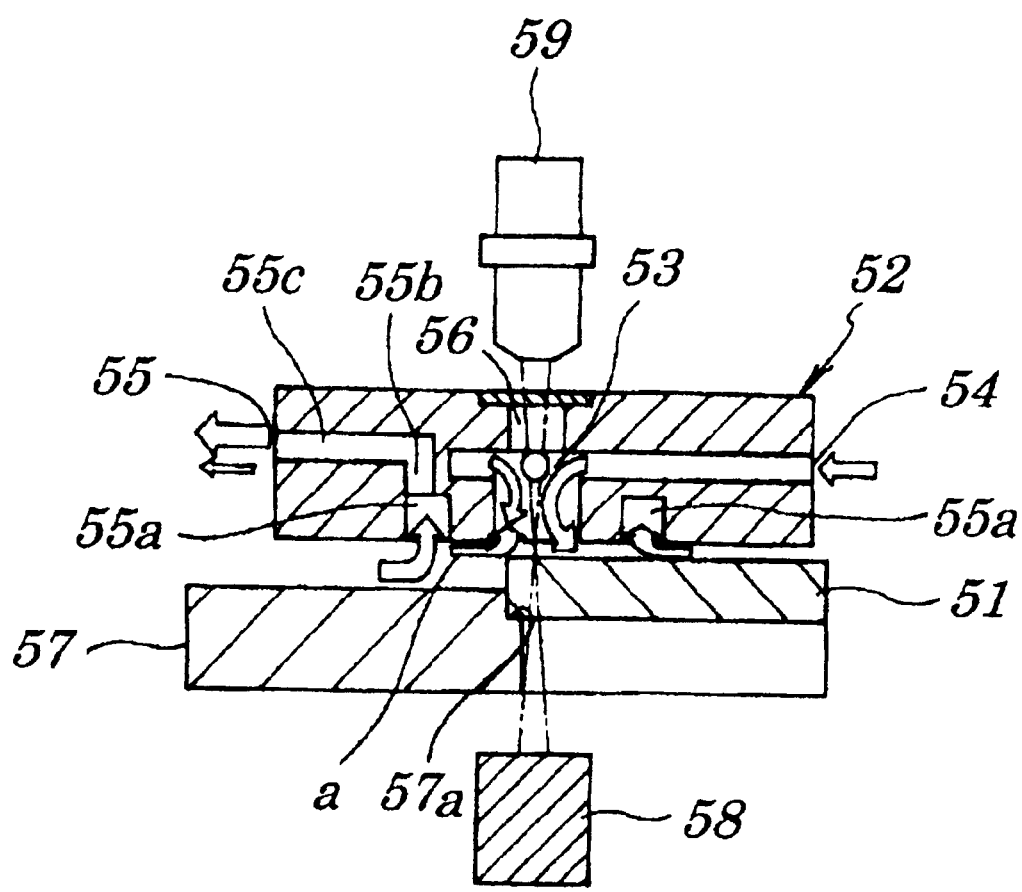
FIG. 4 is a cross-sectional view of conventional thin film forming equipment.

In the conventional equipment (10 as shown in FIG. 4) not having the cover, a transparent film having no light-interceptive characteristic is formed at a position being by 10 mm inside from the end portion of the substrate 51. The resulting film shows that oxygen (air) has entered into the gas retention chamber 53. That is, due to the flow-in of oxygen into the gas retention chamber 53, the film formed by the CVD process is not metal chromium, but chromium oxide, resulting in the formation of the transparent film described above. The analysis of a concentration of Cr by collecting the gas flowing around the gas window 52 has revealed that the concentration of Cr exceeds 1 ppm (when converted to gas concentration). This shows that the gas Cr $(CO)_6$ has leaked to the surroundings.

In contrast, in the equipment provided with the cover 10 according to the first embodiment as shown in FIG. 1, a desired light-interceptive Cr film is formed even at the end portion of the substrate 1. This shows that no oxygen (air) has flowed into the gas retention chamber 3 and the film formed by the CVD process is metal chromium. The analysis of the concentration of Cr by collecting the gas flowing around the gas window 52 has revealed that the concentration of Cr is not more than 0.05 ppm (within the limit of measurement). This shows that the gas $Cr(CO)_6$ has not leaked to the surroundings.

As described above, unlike in the case of the prior art shown in FIG. 4, according to the present embodiment, by providing the cover 10, the step section 7a can be removed. However, if the depth of a step section 7a of the holder 7 is equal to a thickness of the substrate 1, the step can also be removed without the cover 10. There is, however, problem in that it is difficult to take the substrate 1 from the holder 7 easily.

Second Embodiment

Figure 2:
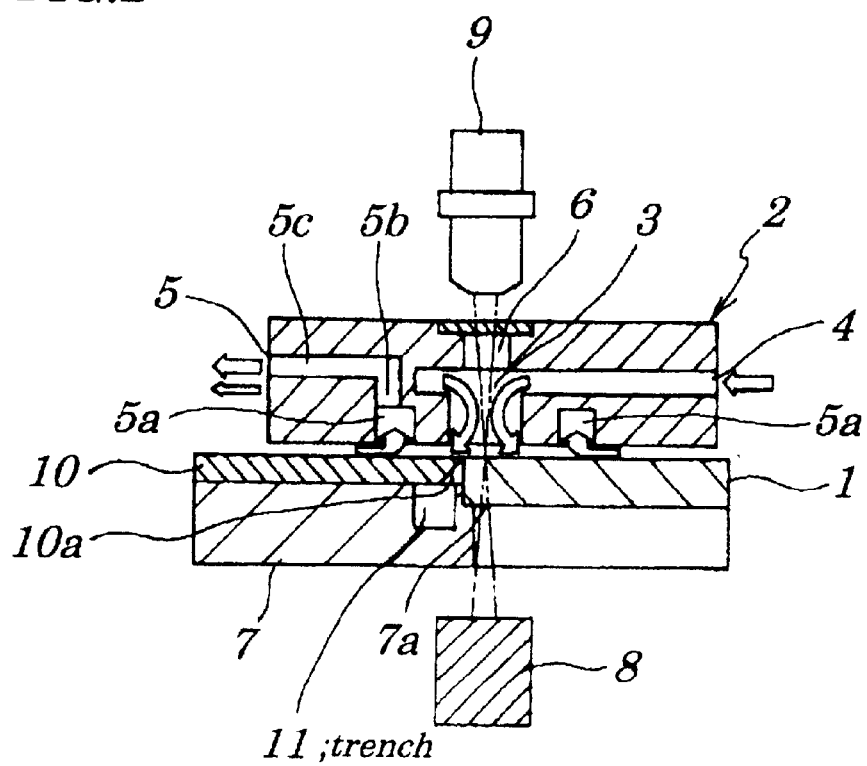
FIG. 2 is a cross-sectional view of thin film forming equipment according to a second embodiment of the present invention.
Figure 3:
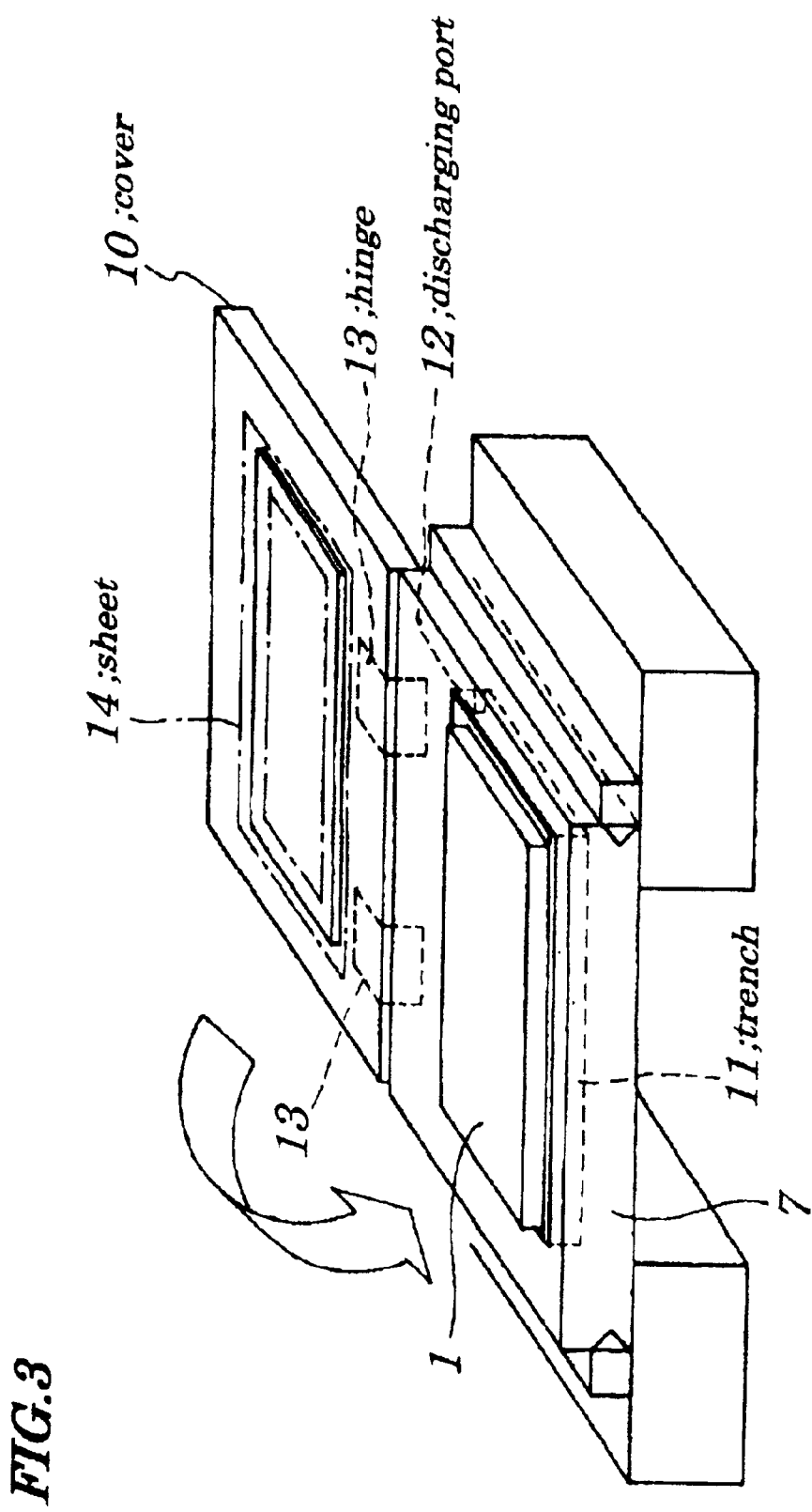
FIG. 3 is a perspective view of the thin film forming equipment according to the second embodiment.

FIG. 2 is a cross-sectional view of thin film forming equipment according to a second embodiment of the present invention. FIG. 3 is a perspective view of the thin film forming equipment according to the second embodiment.

In the thin film forming equipment according to the second embodiment, a holder 7 is provided with trenches 11 along the circumference (on 4 sides) of the substrate 1 and these trenches 11 are communicating with discharging ports 12. The cover 10 is of a type of rotational movement opening and closing with hinges 13. Configurations of the thin film forming equipment of the second embodiment are the same as those of the first embodiment except those described above and the same reference numbers in the second embodiment designate corresponding parts in the first embodiment. Detailed description of the same configuration is omitted accordingly.

In the thin film forming equipment according to the second embodiment, by providing the holder 7 with the trenches 11 and the discharging port 12, the leak of the CVD materials to the surroundings can be more completely prevented. Moreover, even if the clearance between the substrate 1 and the cover 10 becomes larger somewhat, the leak of the CVD materials can be avoided and the degradation in quality of the film to be formed is small. For example, in the first embodiment, the clearance between the substrate 1 and the cover 10 is set to be 0.1 mm. However, in the second embodiment, even if the clearance is set to 0.3 mm, the leak of the CVD materials and the degradation of the film quality can be successfully prevented. This means that high accuracy in attaching the cover 10 is not required so much, making easy the mounting of the cover 10. Furthermore, since the clearance between the substrate 1 and the cover 10 can be somewhat larger, the damage to the substrate at a time of opening and closing can be minimized.

Also, according to the second embodiment, a sheet 14 (for example, a Teflon sheet with thickness of 30 μm) is provided along an aperture of the cover 10 (as shown by dashed lines in FIG. 3). When the cover 10 is closed at the substrate 1 disposed on the holder 7, since an end of the sheet 14 is positioned fitly along an end portion of the substrate 1, even if the clearance between the substrate 1 and the cover 10 is somewhat wide, neither the leak of the CVD material gas nor degradation of the film to be formed occurs. Therefore, the clearance of 0.5 mm between the substrate 1 and the cover 10 is possible to achieve the above purposes.

As described above, according to the present invention, the thin film of high quality can be formed and the leak of the CVD material gas to the surroundings can be prevented at a low cost.

It is apparent thus that the present invention is not limited to the above embodiments but may be changed and modified without departing from the scope and spirit of the invention.

Finally, the present application claims the priority of Japanese Patent Application No. Hei11-080506 filed on Mar. 24, 1999, which is herein incorporated by reference.

What is claimed is:

1. A method for forming a thin film on a substrate by decomposing gas introduced to a surface of a substrate held by a substrate holding device having a cover body which is disposed in an area surrounding said substrate held by said substrate holding device, said cover body being able to open and close by rotational movement, said method comprising:

a step of preventing said gas introduced to said surface of said substrate from being influenced by outside air, wherein a clearance between an upper face of said cover body and an upper face of said substrate is set to be 0.5 mm or less.

2. The method for forming a thin film according to claim 1, wherein said substrate holding device is provided with a trench along a circumference of the held substrate and the introduced gas is able to be discharged through said trench.

3. The method for forming a thin film according to claim 1, wherein a sheet is provided at a boundary between said held substrate and said substrate holding device.

4. A method for forming a thin film on a substrate by introducing gas to a surface of a substrate held by a substrate holding device having a cover body which is disposed in an area surrounding said substrate held by said substrate holding device, said cover body being able to open and close by rotational movement, by radiating said introduced gas with laser, by decomposing said introduced gas and then by suctioning and discharging decompositional by-products, said method comprising:

a step of preventing said gas introduced to said surface of said substrate from being influenced by outside airs, wherein a clearance between an upper face of said cover body and an upper face of said substrate is set to be 0.5 mm or less.

5. The method for forming a thin film according to claim 4, wherein said substrate holding device is provided with a trench along a circumference of the held substrate and the introduced gas is able to be discharged through said trench.

6. The method for forming a thin film according to claim 4, wherein a sheet is provided at a boundary between said held substrate and said substrate holding device.

* * * * *